(12) United States Patent
Hwang et al.

(10) Patent No.: US 10,147,693 B2
(45) Date of Patent: Dec. 4, 2018

(54) METHODS FOR STUD BUMP FORMATION

(71) Applicant: Taiwan Semiconductor Manufacturing Company, Ltd., Hsin-Chu (TW)

(72) Inventors: Chien Ling Hwang, Hsin-Chu (TW); Yeong-Jyh Lin, Caotun Township (TW); Yi-Li Hsiao, Hsin-Chu (TW); Ming-Da Cheng, Jhubei (TW); Tsai-Tsung Tsai, Taoyuan (TW); Chung-Shi Liu, Hsin-Chu (TW); Mirng-Ji Lii, Sinpu Township (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 48 days.

(21) Appl. No.: 14/703,260

(22) Filed: May 4, 2015

(65) Prior Publication Data
US 2015/0235975 A1    Aug. 20, 2015

Related U.S. Application Data

(62) Division of application No. 13/527,459, filed on Jun. 19, 2012, now Pat. No. 9,021,682.

(60) Provisional application No. 61/581,327, filed on Dec. 29, 2011.

(51) Int. Cl.
*H01R 9/00* (2006.01)
*H01L 23/00* (2006.01)

(52) U.S. Cl.
CPC ....... *H01L 24/11* (2013.01); *H01L 2224/1111* (2013.01); *H01L 2224/1134* (2013.01)

(58) Field of Classification Search
CPC ....... H01L 2924/00014; H01L 2924/00; H01L 2224/1134; H01L 2224/056; H01L 2224/13005; H01L 2224/13111; H01L 2224/13124
See application file for complete search history.

(56) References Cited

U.S. PATENT DOCUMENTS

| | | | |
|---|---|---|---|
| 3,612,369 A | 10/1971 | Grebe et al. |
| 4,572,421 A | 2/1986 | Hug et al. |
| 4,628,600 A | 12/1986 | Gordon et al. |
| 4,950,866 A | 8/1990 | Kojima et al. |

(Continued)

FOREIGN PATENT DOCUMENTS

| JP | 2001053097 | 2/2001 |
|---|---|---|
| KR | 1019980043251 | 6/1999 |

(Continued)

OTHER PUBLICATIONS

Dixit, V. et al., "Wire Bonding Considerations—Design Tips for Performance and Reliability," Solid State Technology Insights for Electronics Manufacturing, http://electroiq.com/blog/2006/07/wire-bonding-considerations/, Jul. 2006, 10 pgs.

*Primary Examiner* — Minh Trinh
(74) *Attorney, Agent, or Firm* — Slater Matsil, LLP

(57) ABSTRACT

An apparatus includes a spool configured to supply a wire, a cutting device configured to form a notch in the wire, and a capillary configured to bond the wire and to form a stud bump. The apparatus is further configured to pull the wire to break at the notch, with a tail region attached to the stud bump.

20 Claims, 14 Drawing Sheets

(56) References Cited

U.S. PATENT DOCUMENTS

| | | | |
|---|---|---|---|
| 5,299,729 A * | 4/1994 | Matsushita | B23K 20/007 228/180.22 |
| 6,581,283 B2 * | 6/2003 | Sugiura | H01L 21/4853 228/180.5 |
| 6,687,988 B1 | 2/2004 | Sugiura et al. | |
| 7,225,538 B2 | 6/2007 | Eldridge et al. | |
| 7,227,095 B2 | 6/2007 | Roberts et al. | |
| 8,540,136 B1 | 9/2013 | Lin et al. | |
| 9,021,682 B2 * | 5/2015 | Hwang | H01L 24/11 228/180.5 |
| 9,209,147 B1 * | 12/2015 | Foong | H01L 24/13 |
| 2007/0082017 A1 | 8/2007 | Toyama et al. | |
| 2007/0187467 A1 | 8/2007 | Toyama et al. | |
| 2015/0235975 A1 * | 8/2015 | Hwang | H01L 24/11 438/617 |

FOREIGN PATENT DOCUMENTS

| | | |
|---|---|---|
| TW | 469551 | 12/2001 |
| WO | 2011154061 | 12/2011 |

\* cited by examiner

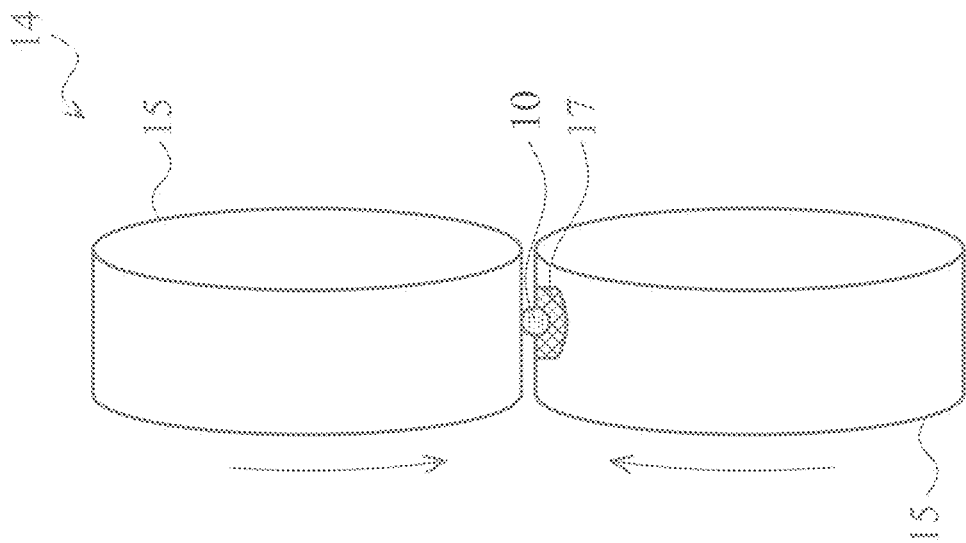
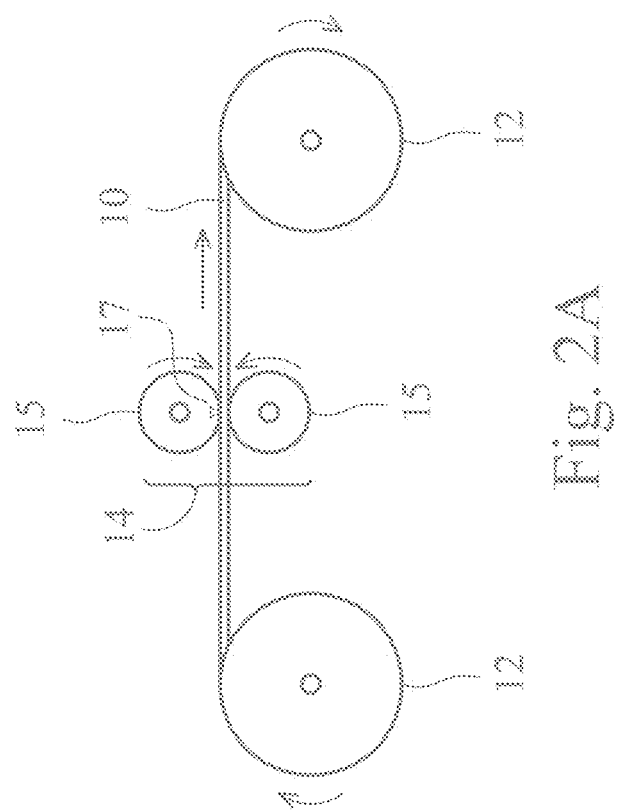
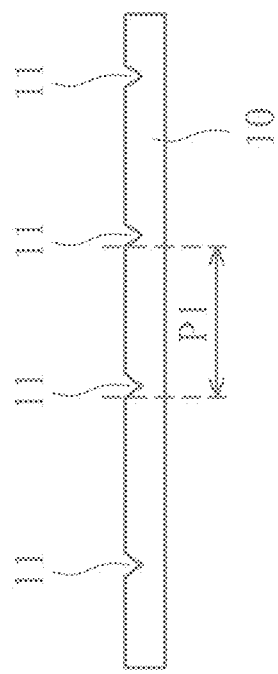
Fig. 2C
Fig. 2A
Fig. 2B

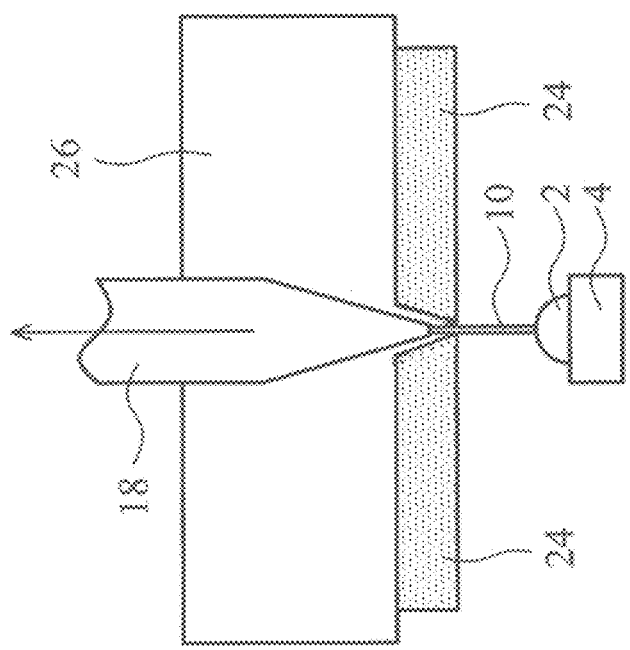
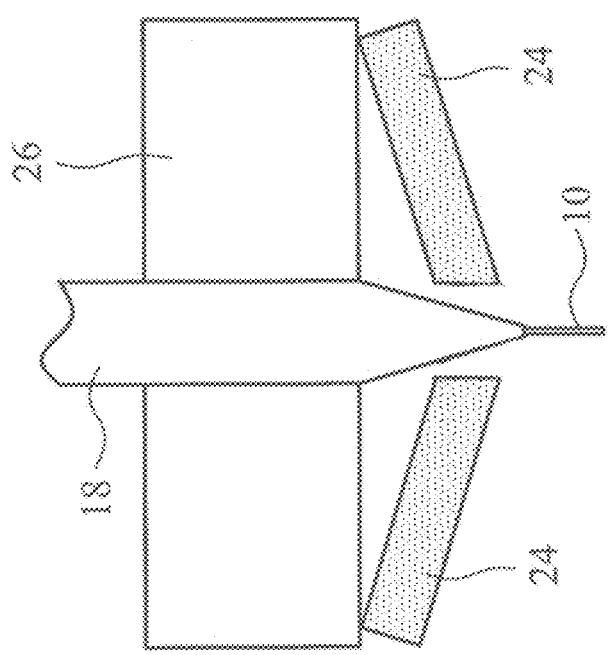

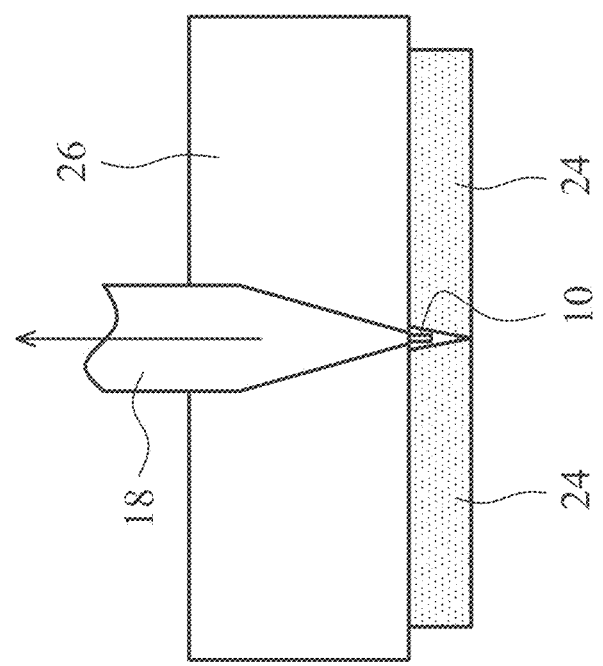

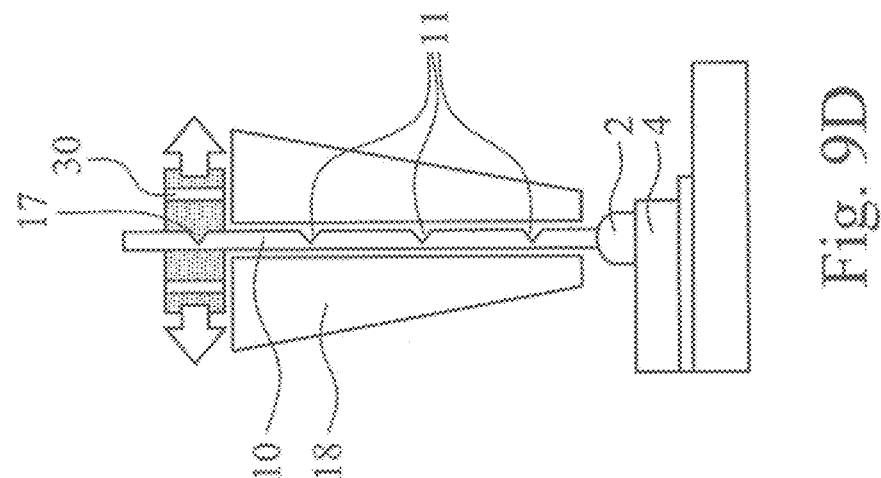
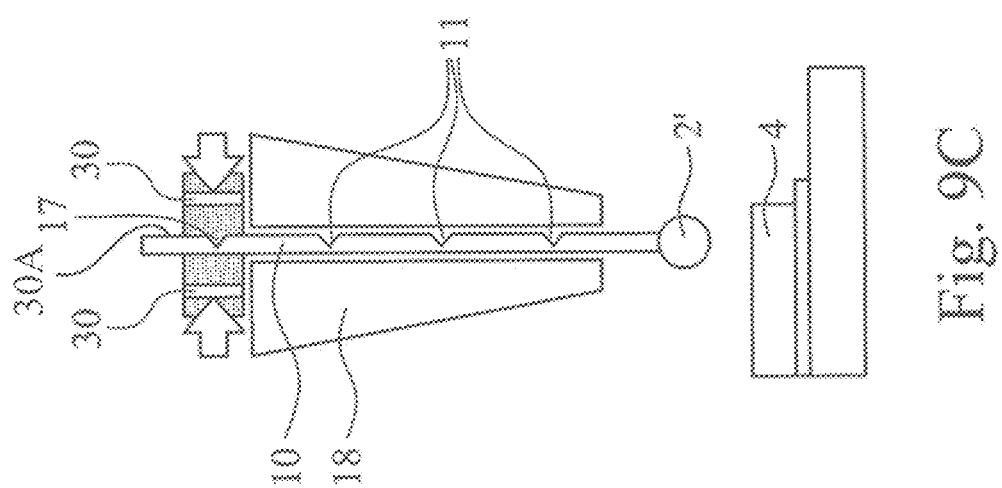

METHODS FOR STUD BUMP FORMATION

PRIORITY CLAIM AND CROSS-REFERENCE

This application is a divisional of U.S. patent application Ser. No. 13/527,459 entitled "Methods for Stud Bump Formation and Apparatus for Performing the Same," filed Jun. 19, 2012 which application claims the benefit of the following provisionally filed U.S. Provisional Application Ser. No. 61/581,327, filed Dec. 29, 2011 entitled "Process and Apparatus for Au or Cu Connector," which application is hereby incorporated herein by reference.

BACKGROUND

As integrated circuit device density increases, the need for improved packaging schemes also increases. For example, when the densities of the integrated circuit device increase, the densities of the respective connectors, such as bond pads, copper bumps, wire bonds, solder joints, and the like, also increase. The increased densities result in stricter requirements to the bonding processes. The sizes of the solder bumps need to be reduced without sacrificing the quality of the resulting solder-containing bonds.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2A through 2C illustrate schematically a first embodiment process for pre-notching a wire;

FIGS. 6A through 6E illustrate schematically a fifth embodiment process for forming a stud bump using a spring blade;

FIGS. 9A through 9F illustrate schematically a sixth embodiment process for forming a stud bump by notching the wire when a clamp clamps the wire.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Tall wire-bonding stud bumps and the methods of forming the same are provided in accordance with various exemplary embodiments. The intermediate stages of forming the stud bumps are illustrated. The variations and the operation of the embodiments are discussed. Throughout the various views and illustrative embodiments, like reference numbers are used to designate like elements. The tall stud bumps, sometimes referred to herein as bumps, provide for more efficient integration into a variety of packaging processes.

Figure 1:
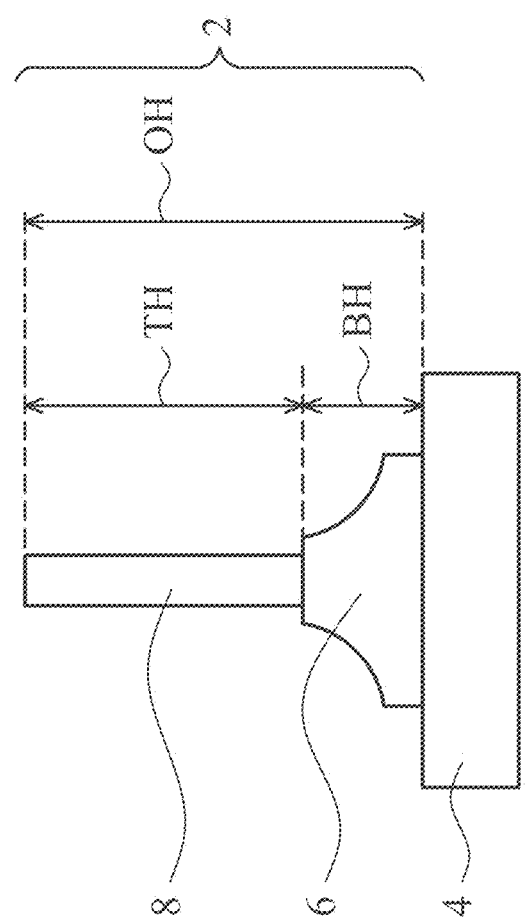
FIG. 1 illustrates schematically an illustrative stud bump formed accordance with embodiments, wherein a tail of wire is attached to a stud bump.

FIG. 1 illustrates an exemplary stud bump 2 having a bump region 6 and a tail region 8. Stud bump 2 is formed on electrical connector 4, which may be a bond pad, a metal line, an additional stud bump, or the like. Electrical connector 4 may further be a surface feature located at a surface of an integrated circuit component (not shown), which may be device die, a package substrate, an interposer, or the like. Bump region 6 has a height indicated as BH, tail region 8 has a height indicated as TH, and stud bump 2 has an overall height indicated as OH. Tail region 8 is at an upright position. In some illustrative embodiments, the tail region height TH can be in a range from about 15 µm to about 30 µm. In other illustrative embodiments, TH can range from about 30 µm to about 100 µm. In yet other embodiments, TH can be greater than about 100 µm, with an upper limit that approaches the length for gravity tilt (i.e., the point at which the tail 8 can no longer support itself against the pull of gravity, which height varies depending upon the diameter of the tail region). Height OH may be greater than about 200 µm or greater than about 300 µm in some exemplary embodiments. Stud bump 2 may be formed of copper or gold in illustrative embodiments, although other conductive materials such as aluminum, silver, platinum, palladium, tin, and the like are within the contemplated scope of the embodiments.

FIGS. 2A, 2B, and 2C illustrate an illustrative process for achieving stud bump 2 (illustrated in FIG. 1) in accordance with some exemplary embodiments. Stud bump 2 may be formed from wire 10, such as a copper or gold wire. In the embodiments of FIG. 2A, wire 10 is run between spools 12 before being contacted to, for example, electrical connector 4 for forming stud bump 2 thereon (see FIG. 1). As wire 10 passes between spools 12, wire 10 is passed through notcher 14. FIG. 2B illustrates notcher 14 in further detail. As shown, notcher 14 includes two rollers 15 between which wire 10 passes. One, or alternatively both, of rollers 15 has formed therein a cavity (refer to FIG. 2B). Contained within the cavity is a razor or other cutting device 17 that cuts, but does not sever, wire 10—thus forming notch 11 (FIG. 2C) in wire 10. With each rotation of roller 15, the cutting device 17 contacts and notches wire 10. Although one cutting device 17 is illustrated in FIG. 2B, more than one cutting device may be formed on one or both of rollers 15 to reduce the pitch of notches 11 in wire 10. One skilled in the art will recognize the relationship between the diameter of rollers 15, the spacing between cutting devices 17 (if more than one), and pitch P1 of the resulting notches 11 (FIG. 2C) in wire 10. FIG. 2C illustrates wire 10 in greater detail after having passed between rollers 15 and having been notched. As is illustrated, notches 11 are formed periodically on wire 10, and each of notches 11 may be used for forming one stud bump 2 (FIG. 1).

In the embodiment illustrated in FIGS. 2A through 2C, wire 10 is pre-notched prior to a process for forming stud bumps. The pre-notched wire 10 is then used for performing the wire bonding. The apparatus for using the pre-notched wire 10 to form stud bump 2 (FIG. 1) is similar to what is shown in FIG. 3, except that notcher 14 in FIG. 3 will not be used, because the wire on spool 12 has already been pre-notched.

Figure 3:
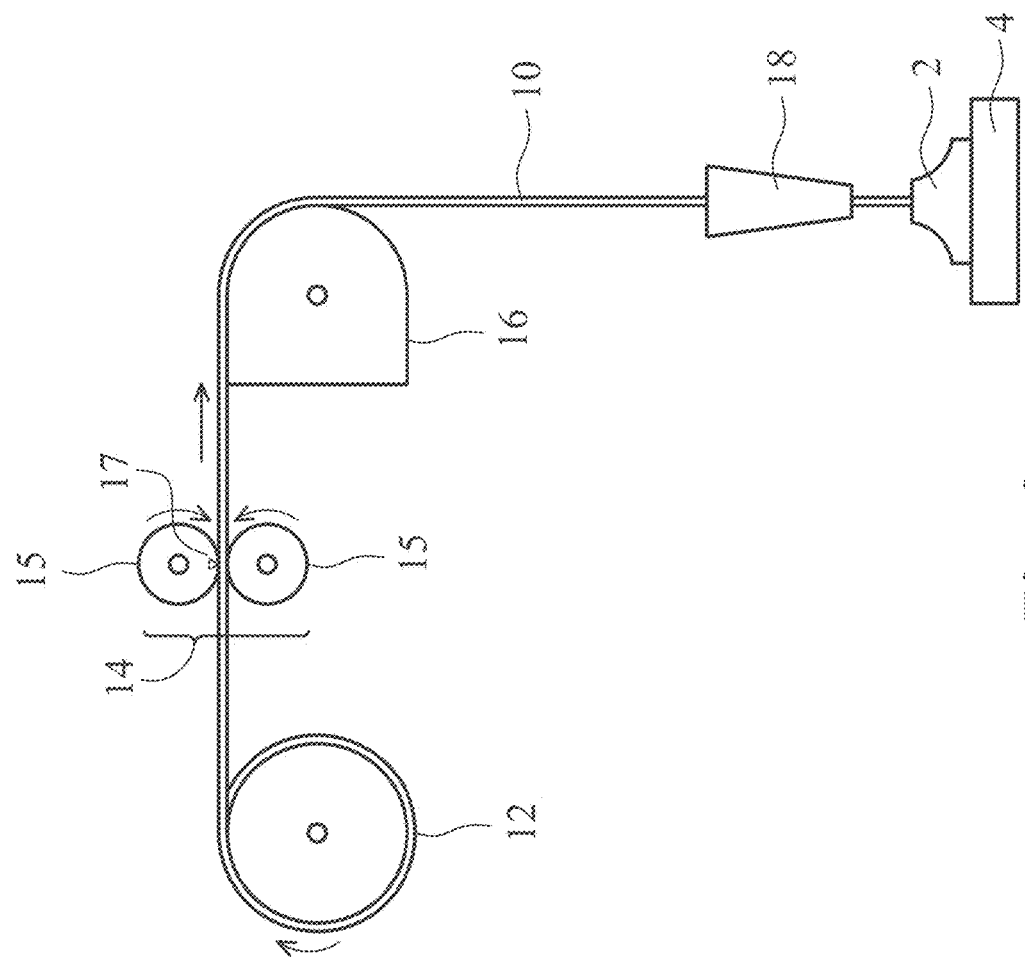
FIG. 3 illustrates schematically a second embodiment process for in-situ notching a wire.

FIG. 3 illustrates alternative embodiments, wherein wire 10 is notched in-situ, as part of the stud bump formation process. In this illustrative embodiment, wire 10 passes from spool 12 to pulley 16. Notcher 14, which may be similar to the notcher illustrated in FIG. 2B, is situated between spool 12 and pulley 16, and notches wire 10 in real-time as wire 10 passes from spool 12 to pulley 16. The resulting notched wire 10 is essentially the same as schematically illustrated in FIG. 2C. Pulley 16 takes up notched wire 10 and feeds it to capillary 18. Capillary 18 is also sometimes referred to as capillary 18. Capillary 18 positions wire 10 in an appropriate location (e.g., over electrical connector 4 of an integrated circuit die, a Printed Circuit Board (PCB), an interposer, or the like), and bonds wire 10 to, e.g., electrical connector 4, using one or more of heat, pressure, sonic vibration, thermocompression, and the like.

As those skilled in the art will appreciate, notched wire 10 will be weak, relative to un-notched regions, at the notches. Hence, wire 10 is clamped and lifted up (relative to electrical connector 4, also shown in FIG. 1), wire 10 will break at the notch region. By controlling the distance between notched regions (as discussed above), one can carefully control the height TH of tail region 8 (FIG. 1) of the resulting stud bump 2. This in turn allows for precise control over the overall height OH of stud bump 2. Tail region 8, after being broken, may be upright.

FIGS. 4A through 4D illustrate alternative embodiment processes for forming stud bump 2. In this embodiment, wire 10 is un-notched when it passes through capillary 18, and before it is fed to capillary 18. In a step illustrated in FIG. 4A, un-notched wire 10 has been fed to capillary 18 and has been put into contact with electrical connector 4 to form stud bump 2. After the formation of stud bump 2, wire 10 is notched or crimped by way of clamp 20. Clamp 20 pinches wire 10 between its clamp arms to crimp or otherwise notch, and probably not sever, wire 10.

Figure 4A:
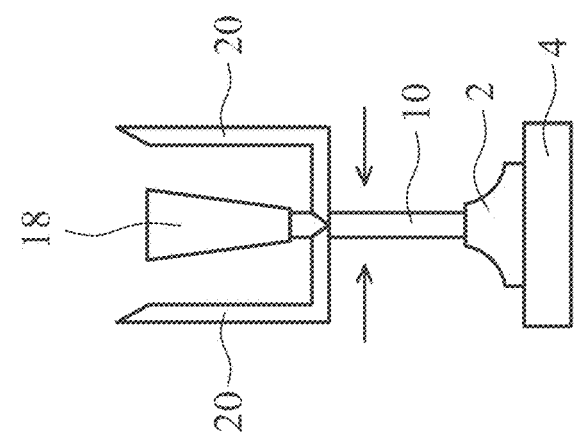
FIGS. 4A through 4D illustrate schematically a third embodiment process for forming a stud bump by mechanically crimping the wire after the bonding.
Figure 4B:
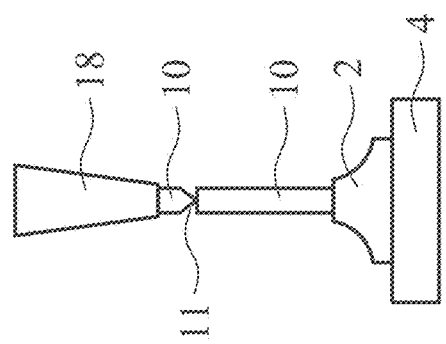
Figure 4C:
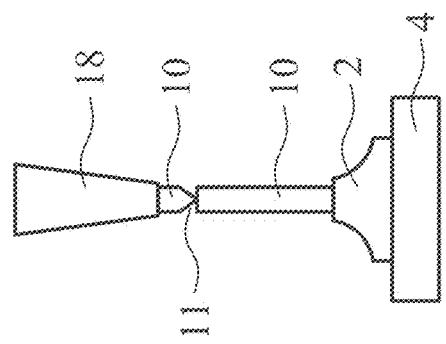
Figure 4D:
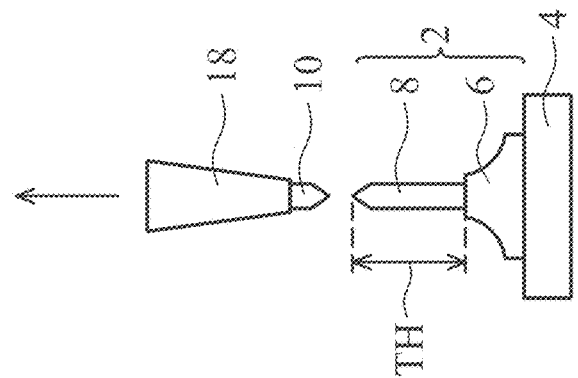

FIG. 4B illustrates wire 10 after clamp 20 has notched wire 10 and then been removed or not. At this point, capillary 18 begins moving upward (relative to stud bump 2), stretching and straining wire 10, as illustrated in FIG. 4C. As illustrated in FIG. 4D, wire 10 will break at the point where wire 10 has been notched by clamp 20. One skilled in the art will recognize that the height TH of resulting stud bump 2 can be precisely controlled by appropriately placing clamp 20 during the crimping process.

Figure 5C:
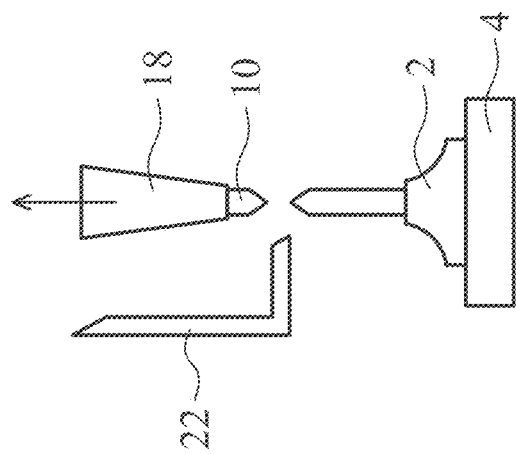
FIGS. 5A through 5C illustrate schematically a fourth embodiment process for forming a stud bump by weakening the wire.
Figure 5B:
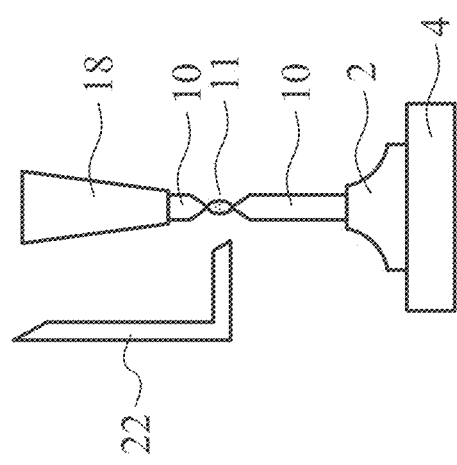
Figure 5A:
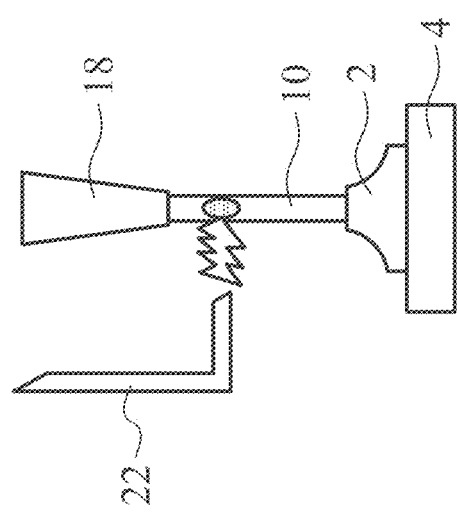

FIGS. 5A through 5D illustrate yet another embodiment process for forming stud bump 2. In this illustrated embodiment, heating element 22 is used to form a weak spot in wire 10. Again in this embodiment, it is not necessary to pre-notch wire 10 (although in some embodiments, it may be desirable to employ both the notching technique of FIGS. 1 and/or 2 with the additional technique of FIGS. 4A through 5C). FIG. 5A illustrates the point in the process where wire 10 has been bonded to electrical connector 4 to from stud bump 2, using capillary 18. Heating element 22 is brought into proximity or contact with wire 10 at a point where it is desirable to form a weak point in wire 10 (analogous to the notch formed in previously described embodiments). Heating element 22 may be a resistive heating element, an inductive heating element, a device emitting highly concentrating RF or other energy, such as a spark, or the like. In some embodiments, heating element 22 is applied with a high voltage, which may be lower than the voltage form melting the tip of wire 10 (see FIG. 9B), so that wire 10 is heated and softened.

In the illustrative embodiments, heating element 22 heats wire 10 in a highly localized region, as illustrated in FIG. 5B, causing a portion of wire 10 to soften, weaken, and possibly deform slightly, but not necessarily to melt completely or sever. As capillary 18 moves upward, wire 10 separates at the weakened spot caused by heating element 22, as illustrated in FIG. 5C. Although in the illustrated embodiments, heating element 22 is shown as remaining in proximity or contact with wire 10 during the entire process, in some embodiments, heating element may be removed from wire 10 prior to the movement of capillary 18 away from electrical connector 4.

Figure 6A:
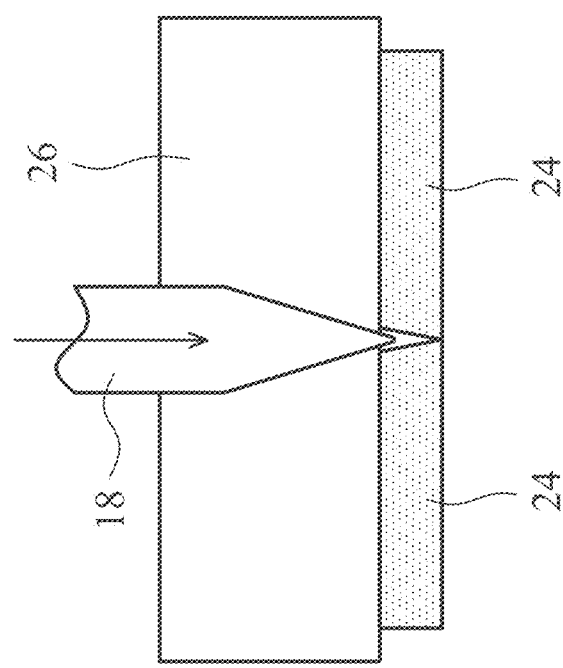

FIGS. 6A through 6E illustrate yet other embodiments. In these embodiments, wire 10 is self-cut by the action of capillary 18 forcing wire 10 through spring blade 24, and then pulling wire 10 by a clamp back out of spring blade 24. FIG. 6A shows capillary 18 moving toward spring blade 24. Also shown in FIG. 6A is tube 26 surrounding capillary 18. Tube 26, which may be a ceramic tube, allows for, e.g., the passage of an inert gas (such as nitrogen ($N_2$), a reduction gas (such as hydrogen ($H_2$), and/or other gases. The gas in turn blows over wire 10 during a sparking step in which a ball is formed at the tip of wire 10 (see FIGS. 9B and 9C).

Figure 6B:
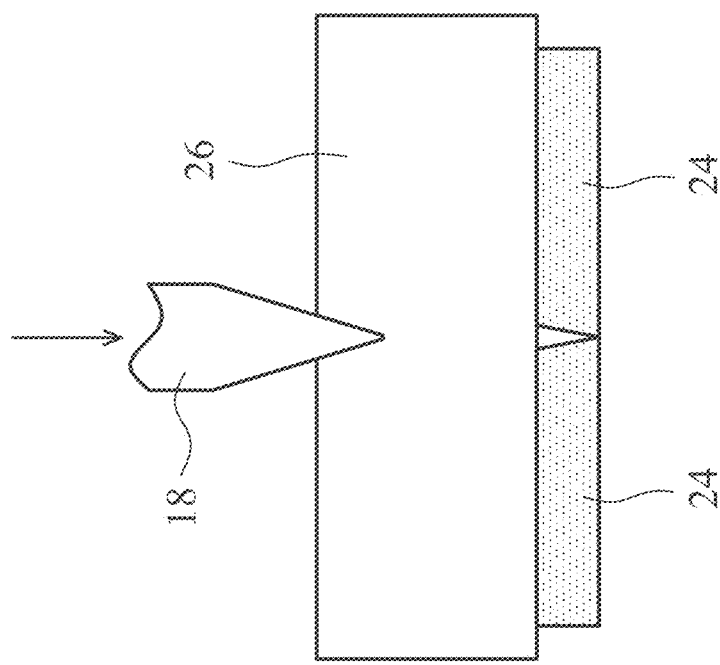
Figure 7B:
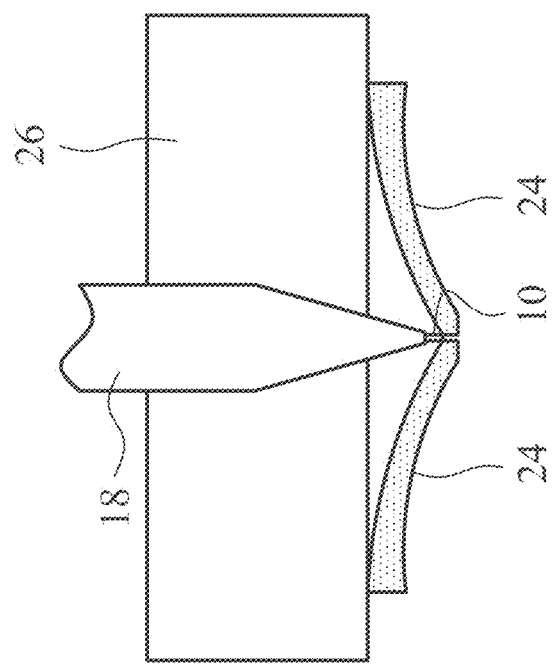
FIGS. 7A through 7C illustrate schematically additional spring blades with different shapes.
Figure 7A:
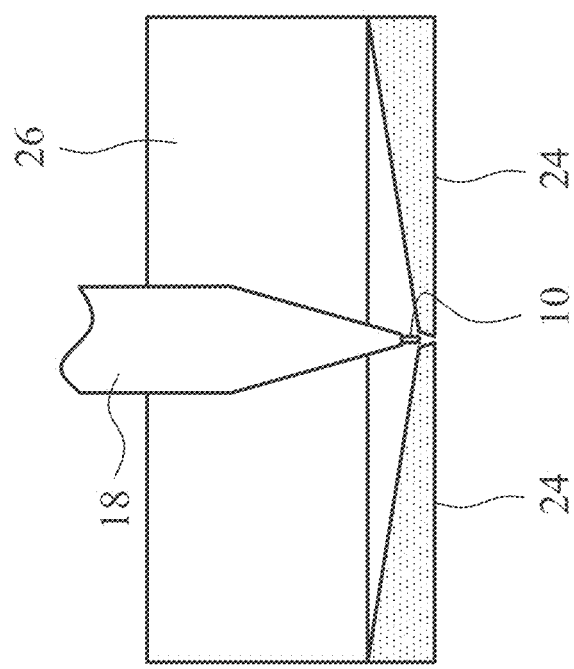
Figure 7C:
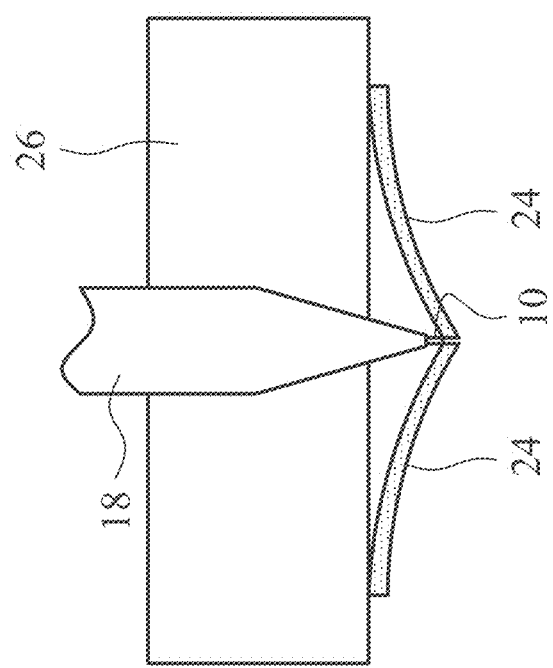

FIG. 6B illustrates capillary 18 forcing wire 10 into spring blade 24. As shown in FIG. 6C, capillary 18 further moves downward, causing spring blade 24 to open. The opposite blades of spring blade 24 separate, allowing wire 10 and perhaps a tip of capillary 18 to pass through. Next, after the bonding for forming stud bump 2 (FIG. 1), as capillary 18 moves upward, the blades of spring blade 24 snap back into place, closing upon each other and severing wire 10. This is illustrated in FIG. 6D. FIG. 6E illustrates that wire 10 is cut. The process of passing wire 10 through spring blade 24 and severing wire 10 can be repeated. In the illustrative embodiments, however, a single pass through spring blade 24 is sufficient to from stud bump 2, such as illustrated in FIG. 1.

Figure 8A:
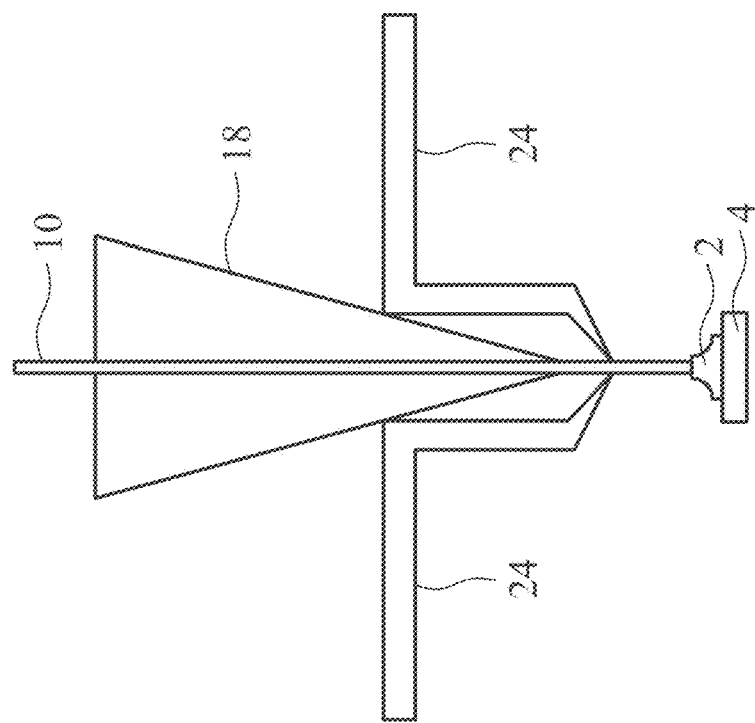
FIGS. 8A and 8B illustrate schematically using an additional spring blade to notch a wire.
Figure 8B:
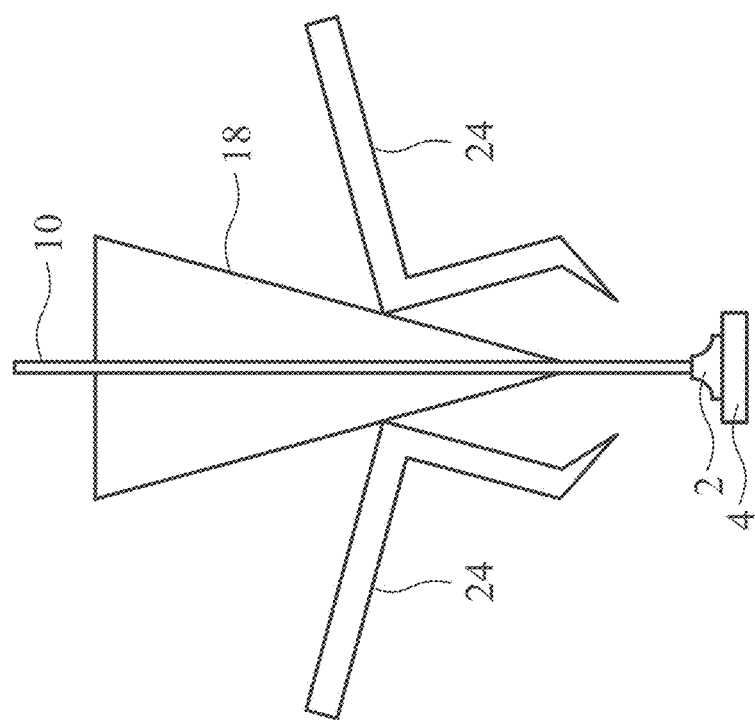

FIGS. 7A through 8B illustrate different shapes of spring blades that can be employed. An advantageous feature of the embodiment illustrated in FIGS. 7A through 8B is that no external actuator is required for severing wire 10. Wire 10 is cut automatically by the operation of wire 10 passing through the blades of spring blade 24 and then being pulled back out from between the blades. One skilled in the art will recognize that a desired tail region height TH (see FIG. 1) can be readily obtained by the appropriate shape and the placement of spring blade 24. FIGS. 8A and 8B also illustrate that capillary 18 forces spring blade 24 to open, and then pulls back to allow wire 10 to be self-cut.

Figure 9A:
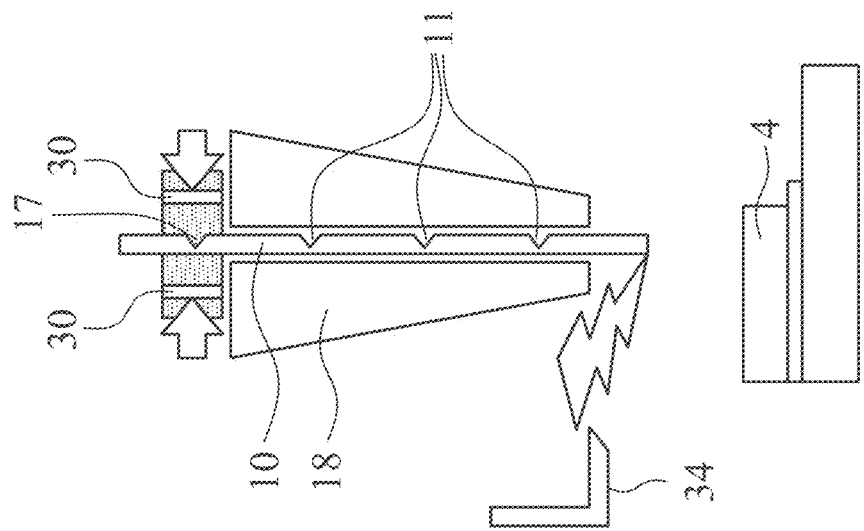
Figure 9B:
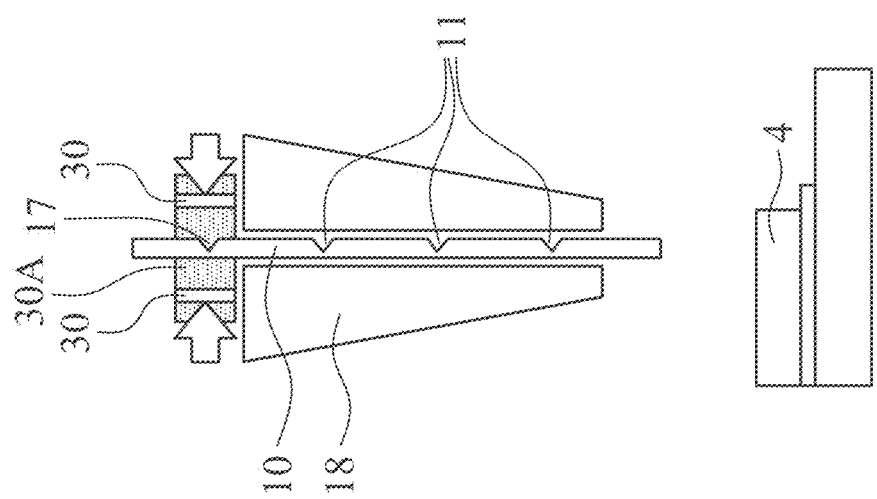

FIGS. 9A through 9F illustrate yet other embodiments. These embodiments are similar to the embodiments in FIG. 3, except that cutting device 17 is installed in clamp 30. Clamp 30 may be located above capillary 18, and may be configured to move up and down in sync with the up-and-down movements of capillary 18. In some embodiments, as illustrated in FIG. 9A, clamp 30 comprises two components on opposite sides of wire 10, with cutting device 17 (for example, a blade) installed on a first component, and wherein the blade faces the second component. The blade of cutting device 17 further protrudes beyond surface 30A of the first component, which surface again faces the second component.

Figure 9E:
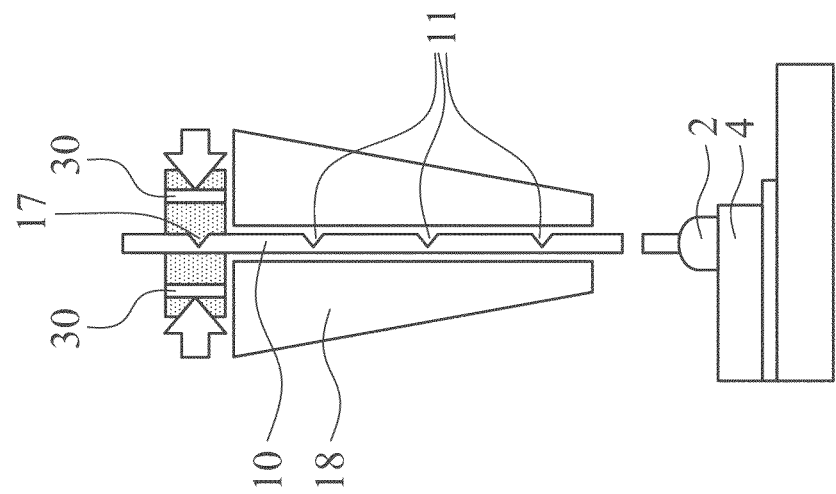
Figure 9F:
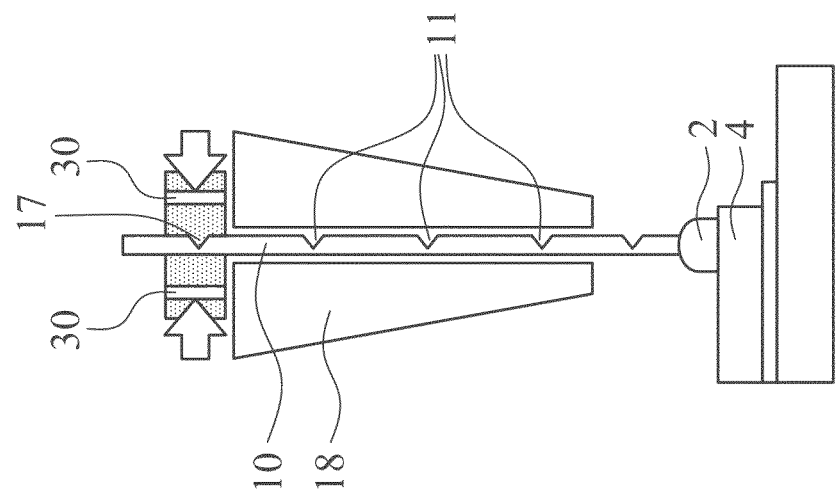

Referring to FIG. 9A, clamp 30 clamps to wire 10, so that when clamp 30 and capillary 18 moves downward, wire 10 moves down along with capillary 18. The clamping of clamp 30 as shown in FIG. 9A may occur, for example, after a previous bonding of a stud bump. Cutting device 17 thus forms a notch in wire 10 when clamp 30 clamps to wire 10. Next, in FIG. 9B, a spark is generated to the tip of wire 10, so that ball 2' is formed at the tip of wire 10, as shown in FIG. 9C. The spark may be generated by Electrical Flame Off (EFO) device 34, which carries a high voltage. In FIG. 9D, clamp 30 and capillary 18 moves downward together, and the bonding is made, so that ball 2' is landed on electrical connector 4 to form stud bump 2. Clamp 30 then releases wire 10, and leaving a newly formed notch 11 in wire 10. Capillary 18 may then move upward without pulling up wire 10. After Capillary 18 moves up to the desirable position, as shown in FIG. 9E, clamp 30 clamps to wire 10 again, and the process further proceeds to FIG. 9A, and the next bonding process can be made.

The stud bump 2 with tall tail 8 (FIG. 1) may be used for solder bonding, wherein a solder region may be formed encircling tail 8. Accordingly, tall tail 8 is used as a support for a relatively tall, but not fat, solder region. The size of the solder region is accordingly reduced, and the density of the solder-based connectors that are formed based on stud bump 2 may be increased.

In accordance with embodiments, an apparatus includes a spool configured to supply a wire, a cutting device configured to form a notch in the wire, and a capillary configured to bond the wire and to form a stud bump. The apparatus is configured to break the wire at the notch.

In accordance with other embodiments, an apparatus includes a spool configured to supply a wire, and a capillary configured to bond the wire to form a stud bump. The apparatus further includes a clamp between the spool and the capillary, wherein the clamp is configured to move up and down in sync with up-and-down movements of the capillary. A cutting device is attached to the clamp, wherein the cutting device is configured to form a notch in the wire in response to clamping on the wire by the clamp.

In accordance with yet other embodiments, a method includes forming a notch in a wire, bonding the wire to an electrical connector and forming a stud bump on the electrical connector, and pulling the wire to break the wire from the stud bump at the notch.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
supplying a wire from a spool;
pushing a capillary through blades of a spring blade to open the spring blade, wherein the wire passes the blades of the spring blade along with the capillary;
bonding using the capillary the wire onto an electrical connector and forming a stud bump on the electrical connector;
after the bonding, pulling the capillary back to allow the spring blade to snap back, wherein the spring blade cuts the wire to form a notch; and
pulling the wire to break the wire from the stud bump at the notch.

2. The method of claim 1 further comprising, after the notch is formed, pulling the capillary to break the wire at the notch.

3. The method of claim 1, wherein the blades comprises two blades located on opposite sides of the wire.

4. The method of claim 1, wherein the blades notch the wire from opposite directions.

5. The method of claim 1, wherein when the capillary is pushed against the blades, the blades open to allow cutting edges of the blades to be spaced apart from the wire.

6. The method of claim 1, wherein the forming the notch in the wire is performed after the wire is supplied out of the spool.

7. The method of claim 1, wherein the pulling the capillary back to allow the spring blade to snap back and the pulling the wire to break the wire are performed simultaneously.

8. The method of claim 1, wherein during the pushing the capillary against blades of the spring blade, the capillary physically pushes on arms of the spring blade, wherein the arms are connected to the blades.

9. A method comprising:
supplying a metal wire through a channel in a capillary;
moving the capillary along with the metal wire toward a bond pad, wherein the capillary pushes arms of a spring blade, so that blades of the spring blade contacting each other are opened to allow the capillary to pass through;
bonding the wire onto the bond pad to form a stud bump;
pulling back the capillary, so that the spring blade cuts the metal wire; and
continuing pulling back the capillary to break the metal wire.

10. The method of claim 9, wherein the spring blade comprises two blades located on opposite sides of the wire, and the spring blade cuts the metal wire to form a notch.

11. The method of claim 10, wherein the spring blade cuts the wire from opposite directions.

12. The method of claim 9, wherein when the capillary is pushed against the blades, the blades open to allow cutting edges of the blades to be spaced apart from the wire.

13. The method of claim 9, wherein the capillary has a tip and a back end wider than the tip.

14. A method comprising:
supplying a wire from a spool;
pushing a capillary against blades of a spring blade to open the spring blade, wherein the wire passes through the capillary and the blades;
bonding using the capillary the wire onto an electrical connector and forming a stud bump on the electrical connector;
after the bonding, pulling the capillary back to allow the spring blade to snap back, wherein blades of the spring blade move against each other to form a notch in the wire; and
pulling the wire to break the wire from the stud bump at the notch.

15. The method of claim 14, wherein the blades comprises two blades located on opposite sides of the wire.

16. The method of claim 15, wherein the blades notch the wire from opposite directions.

17. The method of claim 14, wherein when the capillary is pushed against the blades, the blades open to allow cutting edges of the blades to be spaced apart from the wire.

18. The method of claim 14, wherein the forming the notch in the wire is performed after the wire is supplied out of the spool.

19. The method of claim 14, wherein the pulling the capillary back to allow the spring blade to snap back and the pulling the wire to break the wire are performed simultaneously.

20. The method of claim 14, wherein during the pushing the capillary against blades of the spring blade, the capillary physically pushes on arms of the spring blade, wherein the arms are connected to the blades.

\* \* \* \* \*